(12) United States Patent
Cobbley et al.

(10) Patent No.: US 6,699,928 B2
(45) Date of Patent: Mar. 2, 2004

(54) ADHESIVE COMPOSITION FOR USE IN PACKAGING APPLICATIONS

(75) Inventors: Chad A. Cobbley, Boise, ID (US); Tongbi Jiang, Boise, ID (US); Edward A. Schrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 09/941,495

(22) Filed: Aug. 29, 2001

(65) Prior Publication Data

US 2002/0068379 A1 Jun. 6, 2002

Related U.S. Application Data

(60) Division of application No. 09/065,944, filed on Apr. 24, 1998, which is a continuation-in-part of application No. 08/916,629, filed on Aug. 22, 1997.

(51) Int. Cl.[7] .............................. C08J 3/00; C08K 3/34; C08L 57/02; C08L 39/00
(52) U.S. Cl. ...................... 524/492; 524/493; 524/499; 524/555
(58) Field of Search ............................... 524/492, 493, 524/499, 555

(56) References Cited

U.S. PATENT DOCUMENTS

| | | |
|---|---|---|
| 2,628,178 A | 2/1953 | Burnett et al. |
| 3,142,698 A | 7/1964 | Halpern et al. |
| 3,825,580 A | 7/1974 | Kato et al. |
| 3,832,334 A | 8/1974 | O'Sullivan et al. |
| 3,984,749 A | 10/1976 | Müller |
| 3,987,019 A | 10/1976 | Gruber et al. |
| 4,021,767 A | 5/1977 | Nonaka et al. |
| 4,139,693 A | 2/1979 | Schoenberg |
| 4,167,546 A | 9/1979 | Korshak et al. |
| 4,172,907 A | 10/1979 | Mones et al. |
| 4,209,358 A | 6/1980 | DiLeo et al. |
| 4,295,909 A | 10/1981 | Baccei |
| 4,309,526 A | 1/1982 | Baccei |
| 4,321,180 A | 3/1982 | Kimura et al. |
| 4,490,515 A | 12/1984 | Mariotti et al. |
| 4,533,422 A | 8/1985 | Litke |
| 4,720,513 A | 1/1988 | Kameyama et al. |
| 4,793,887 A | 12/1988 | Card et al. |
| RE32,889 E | 3/1989 | Litke |
| 4,815,208 A | 3/1989 | Raschke |
| 4,837,260 A * | 6/1989 | Sato et al. |
| 4,862,245 A | 8/1989 | Pashby et al. |
| 5,001,542 A | 3/1991 | Tsukagoshi et al. |
| 5,079,098 A | 1/1992 | Liu |
| 5,150,195 A | 9/1992 | Nguyen |
| 5,175,337 A | 12/1992 | Mikuni et al. |
| 5,252,855 A | 10/1993 | Ogawa |
| 5,286,679 A | 2/1994 | Farnworth et al. |
| 5,288,794 A | 2/1994 | Attarwala |
| 5,328,944 A | 7/1994 | Attarwala et al. |
| 5,386,047 A | 1/1995 | Nakos et al. |
| 5,399,416 A | 3/1995 | Bujard |
| 5,424,343 A | 6/1995 | Attarwala |
| 5,536,799 A | 7/1996 | Takahashi et al. |
| 5,589,554 A | 12/1996 | Hiraoka |
| 5,656,945 A | 8/1997 | Cain |
| 5,739,205 A | 4/1998 | Nishino et al. |
| 5,834,836 A | 11/1998 | Park et al. |
| 5,841,193 A | 11/1998 | Eichelberger et al. |
| 5,861,678 A | 1/1999 | Schrock |
| 5,893,726 A | 4/1999 | Farnworth et al. |
| 5,945,733 A | 8/1999 | Corbett et al. |
| 6,049,125 A | 4/2000 | Brooks et al. |

OTHER PUBLICATIONS

Chorbadjiev, K. et al., "The effect of fillers upon the properties of electroconductive cyanoacrylate adhesives," *Int. J. Adhesion and Adhesives*, 8, 143–146 (Jul. 1988).

Cooke, B. D. et al., "Cyanoacrylates and their acid values," *Int. J. Adhesion and Adhesives*, 13, 73–76 (Apr. 1993).

Denchev et al. "Thermal behaviour and adhesive properties of some cyanacrylate adhesives with increased heat resistance," *J Appl Polym Sci.*, 47, 1019–1026 (1993).

Drain, K. F., et al., "The effect of moisture on the strength of polycarbonate–cyanoacrylate adhesive bonds," *Int. J. Adhesion and Adhesives*, 5, 133–136 (Jul. 1985).

Lee, J., "Synthesis and Ring–Opening Polymerizations of 3–Methoxy–4–cyano–2,9–dioxabicyclo[4.3.0] non–3–ene:Preparation of Alternating Head–to–Head Copolymer of Methyl α–cyanocrylate and 2, 3–Dihydrofuran," *Journal of Polymer Science: Part C: Polymer Letters*, 27, 85–91 (1989).

"LOCTITE®", product description sheet, Rocky Hill, CT, 4 pgs. (Dec. 1996).

Loctite Corporation, "VARIDOT™ Surface Mount Adhesive Printing Process," advertising brochure, Rocky Hill, CT.

(List continued on next page.)

*Primary Examiner*—Patrick D. Niland
(74) *Attorney, Agent, or Firm*—Mueting, Raasch & Gebhardt, P.A.

(57) ABSTRACT

An adhesive composition and methods incorporating the adhesive composition in semiconductor applications are provided. The adhesive composition is an instant setting adhesive composition that does not require external energy input such as heat or radiation such for application of the adhesive composition on a surface. The instant setting composition possesses sufficient thixotropic characteristics such that applying the instant setting adhesive composition to a surface can be accomplished by a variety of application techniques and in a variety of patterns. Once applied to the surface, the instant setting adhesive composition sets to retain the discrete pattern as applied, in a relatively short period of time, typically from about 0.10 to about 120 seconds at an ambient temperature, typically from 20° C. to 30° C. Advantageously, the instant setting adhesive composition can be screen printed on a semiconductor wafer prior to singulation because streets between the dice are essentially free of the instant setting adhesive composition.

16 Claims, 4 Drawing Sheets

OTHER PUBLICATIONS

Ito, H., "Thermal Deesterification and Decarboxylation of Alternating Copolymers of Styrene with β–Substituted t–Butyl α–Cyanoacrylates," *Journal of Polymer Science: Part A: Polymer Chemistry, 27*, 2871–2881 (1989).

Melody, D., "Advances in Room Temperature Curing Adhesives and Sealants—A Review," *British Polymer Journal, 21*, 175–179 (1989).

Mikuni et al., "Morphological Study of Cyanocrylate Adhesive Modified by Poly(butadiene–co–acrylonitrile)," *Polym. Networks & Blends, 5(3)*, 159–162 (1995).

Millet, G., "Properties of Cyanoacrylates—An Overview," *Adhesives Age*, 27–32 (Oct. 1981).

Negulescu, I. I. et al., "Thermal Behavior of Poly (α–Cyanoacrylate)," *J. Macromol. Sci–Chem., A24*, 75–83 (1987).

O'Connor, J. T. et al., "Recent Breakthroughs in Thermal Resistant Cyanoacrylate Instant Adhesives," *Society of Manufacturing Engineers*, 303–22 (1993).

Okamoto et al. "Bonding Non–Polar Plastics with Alky Cyanoacrylate Instant Adhesive," Annual Technical Conference and Exhibition, Society of Plastics Engineers (1991).

Palmer, B. J. et al., "A New Photoinitiator for Anionic Polymerization," *Macromolecules, 28* 1328–1329 (1995).

Pepper, D. C., Kinetics and Mechanisms of Zwitterionic Polymerizations of Alkyl Cyanoacrylates, *Polymer Journal, 12*, 629–637 (1980).

Rooney, J. M., "Thermal Degradation of Methyl and Ethyl Cyanocrylate Oligomers," *The British Polymer Journal*, 160–163 (Dec. 1981).

Stein, "Thermal Behavior of Various Poly(2–Cyanoacrylate)S," *Journal of Applied Poly Science, 48*, 441–447 (1991).

Tummala et al., eds., Microelectronics Packaging Handbook, Reinhold, New York, NY 554–557 (1989).

VanZant, P., *Microchip Fabrication*, Second Edition, 485–487 (1990).

Vijayalakshmi, V. et al., "Synthesis of 3–Substituted–2–cyanoacrylates: Their Evaluations as Cross–linkers in Cyanoacrylate Adhesive Compositions," *Journal of Applied Polymer Science, 49*, 1387–1394 (1993).

Microelectronics Packaging Handbook, 554–557 (1989).

* cited by examiner

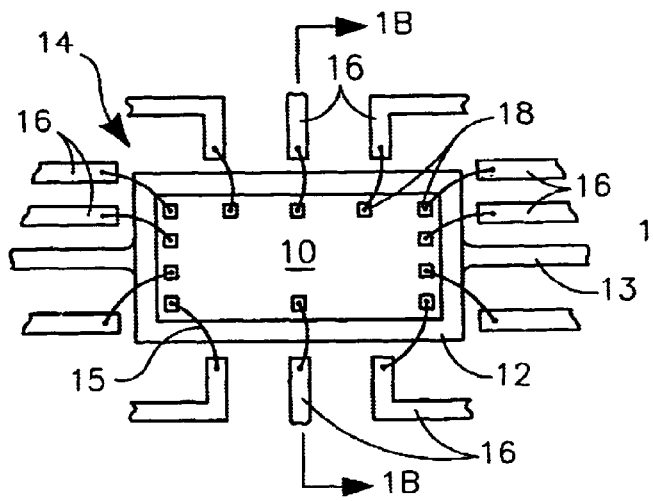
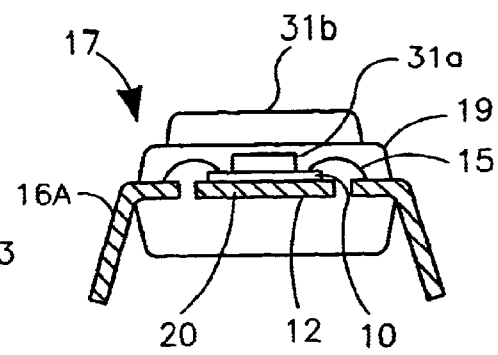
FIGURE 1A　　　　FIGURE 1B
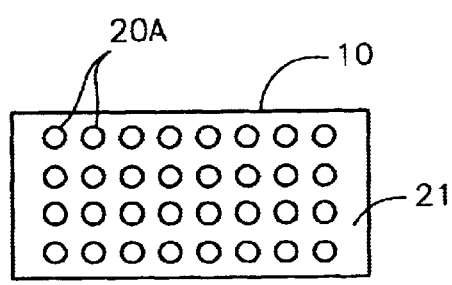
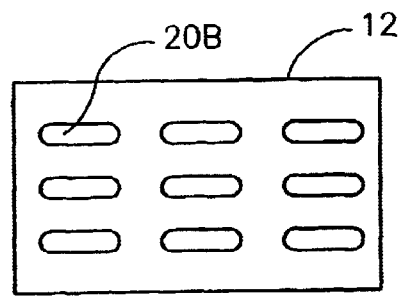
FIGURE 2A　　　　FIGURE 2B
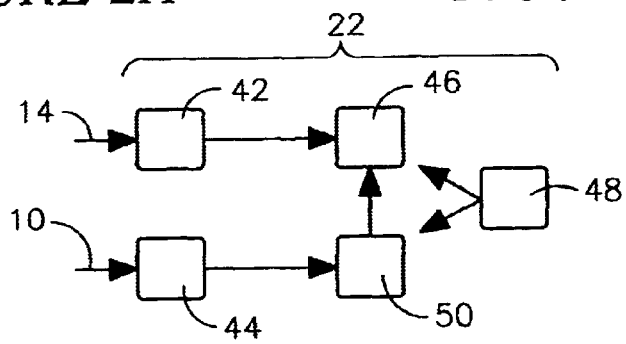
FIGURE 3

ADHESIVE COMPOSITION FOR USE IN PACKAGING APPLICATIONS

This is a division of application Ser. No. 09/065,944, filed Apr. 24, 1998, which is a Continuation-In-Part of U.S. application Ser. No. 08/916,629, filed on Aug. 22, 1997, which are both incorporated herein by reference.

FIELD OF THE INVENTION

This invention relates to an adhesive composition and methods for using an adhesive composition in die packaging applications.

BACKGROUND OF THE INVENTION

In semiconductor manufacture, a single semiconductor die (or chip) is typically mounted within a sealed package. In general, a typical package protects the die from damage (e.g., breakage, physical abuse, etc.) and from contaminants in the surrounding environment (e.g., moisture, dust particles, etc.). In addition, the package provides a lead system for connecting electrical devices of the die to a printed circuit board or other external circuitry.

Each die has a lower surface (also referred to as the back of the die) that is devoid of circuitry, and an upper surface (also referred to as the face of the die) having integrated circuitry constructed thereon. The integrated circuitry is electrically accessible via die wire bonding pads which may be arranged in a variety of configurations on the face or edges of the die.

Typically, an initial component in the packaging process is a leadframe. The leadframe is a metal frame which supports several dice for packaging and provides the leads for a final semiconductor package. A typical leadframe strip is adapted to mount several semiconductor dice.

In one conventional packaging process, each die is attached to a mounting paddle of the leadframe utilizing an adhesive layer. The adhesive layer is typically formed from an adhesive composition including an epoxy, an acrylic, a silicone or a polyimide material located between the bottom surface of the die and an upper surface of the mounting paddle. Also, during the packaging process, bond pads formed on the die are electrically connected to the leads of the leadframe using bond wires. Following the application of a protective layer, for example polyimide, to the face of the die, it and a portion of the leadframe to which it is adhered is encapsulated in a polymeric material. Similarly, all other die-leadframe assemblies on a leadframe strip are encapsulated resulting in encapsulated interconnected packages, i.e., interconnected by way of the leadframe. After encapsulation, a trim and form operation separates the interconnected packages. Leads of each package are also shaped into a desired configuration.

Attempts have been made to increase circuit densities and to improve packaging technologies. For example, some high density circuits, such as 16 mega bit memory devices, use lead-on-chip (LOC) packaging technology. A known lead-on-chip (LOC) semiconductor package is described in U.S. Pat. No. 4,862,245 (Pashby et al.). In general, a LOC die package is formed with a leadframe that does not include a mounting paddle for mounting the die. In the LOC die package, lead fingers of the leadframe are not only for electrical attachment to the bond pads of the die via bond wires but also adhere to the face of the die and support the die during processing. Prior to encapsulation, the die, in effect, is mounted to the lower surface of lead fingers. This configuration provides improved heat transfer from the die and shortens the length of the bond wires. In addition, this configuration enhances the reliability of the package seal.

One method of attaching and wire bonding a LOC die to an LOC leadframe is known as area wire bonding or A-wire bonding. When A-wire bonding is automated, the method typically includes attaching a double-side adhesive tape to the bottom surface of the leadframe fingers. Typically, the double-sided adhesive tape includes a thermoset adhesive on two opposing surfaces of the tape. The face of the die is then attached to a tape surface opposite the leadframe fingers. Generally, attaching the face of the die to the tape surface is accomplished in the presence of heal and pressure. The die-tape-leadframe fingers construction is then heated in an oven to cure the thermoset adhesive. After the adhesive is cured, the leadframe is transferred to a wirebonder machine that connects the bond wires to the bond pads on the die and to the lead fingers of the lead frame. Holes though the adhesive tape allow the bond wires to attach to the bond pads on the die.

In general, an A-wire process is relatively expensive and complicated. For example, the double-sided adhesive tape used in the process is an expensive component because the tape must have an accurate configuration and must be precisely attached to the leadframe fingers for each die to be attached. This is a delicate process and requires precise indexing of the die and precise alignment of the adhesive tape with the die and the leadframe fingers. Moreover, any irregularities (such as buckles, gaps, wrinkles, etc.) in the adhesive tape during attachment to the leadframe fingers tends to cause voids and adhesion problems during attachment of the die, which may ultimately result in the production of a defective product.

In another packaging method, a lead-under-chip (LUC) die may be attached to leadfingers of a leadframe. For example, a tape adhesive on the back of the die or on the leadfingers, along with positioning the die on the lead fingers, results in attachment of the die to the leadframe.

Additionally, because the tape requires an accurate configuration primarily based on the die configuration, many tape configurations (which can vary in tape width, hole patterns, etc.) are required to be stocked by semiconductor manufacturers. This also adds to the expense and complexity of the process. Furthermore, when hole patterns are punched out, a large amount of tape is wasted in the process.

Yet another packaging method includes attaching a semiconductor die to a leadframe as described in U.S. Pat. No. 5,286,679 (Farnworth et al.). The method includes forming a patterned layer of a thermoplastic or thermoset adhesive to one surface of a semiconductor wafer. Individual dice are then singulated from the wafer. During packaging, each adhesive coated die is attached to lead fingers of a leadframe by heating the adhesive layer and pressing the lead fingers, adhesive and die together. This heating process is sufficient to cure the adhesive layer formed from a thermoplastic material. However, when the adhesive layer is formed from a thermosetting material, a separate heating step is required for curing.

Thus, whether adhesive tapes, thermoplastic adhesives or thermoset adhesives arm used, heat, typically at a temperature of about 300° C. or more, is generally supplied to the leadframe-adhesive-die interface during packaging which adds cost, time and equipment to the packaging process.

SUMMARY OF THE INVENTION

In view of the foregoing, there is a need in the semiconductor art for an improved adhesive and methods for using such an adhesive in packaging applications. Accordingly, the present invention is directed to a method for forming a pattern of adhesive on a wafer, a method of attaching a semiconductor die to a leadframe, a method of making a semiconductor package, a semiconductor package and an adhesive composition suitable for use in packaging applications.

One aspect of the present invention provides a method for applying an adhesive to a wafer. Preferably, the method includes the steps of providing a wafer having a surface; and applying an instant setting adhesive composition on the surface of the wafer in a configuration wherein a plurality of portions of the surface have the instant setting adhesive composition applied thereon, and further wherein one or more zones of the surface are essentially free of the instant setting adhesive composition.

The method may also include the step of singulating the wafer to form at least one die having the instant setting adhesive composition on at least a portion thereof. The zones may include singulation streets or regions having exposed bond pads. Additionally, the method may further include the step of applying an adhesion promoter to the surface of the wafer prior to applying the instant setting adhesive composition Another aspect of the present invention provides a method for applying an adhesive to a wafer. Preferably, the method includes the steps of providing a wafer having a surface; and applying an instant setting adhesive composition on the surface of the wafer in a configuration wherein a plurality of portions of the surface have the instant setting adhesive composition dispensed thereon and one or more zones that are essentially free of the instant setting adhesive composition, wherein the instant setting adhesive composition has a thixotropic index from about 4 to about 6. Preferably, the one or more zones include singulation streets and regions having exposed bond pads and further comprising singulating the wafer along the singulation streets to form at least one die having the instant setting adhesive coated on at least a portion thereof.

According to the present invention, an instant setting adhesive composition is also provided. As utilized herein, the instant setting adhesive composition includes an adhesive component selected from the group of a cyanoacrylate adhesive, an anaerobic acrylic adhesive, and mixtures thereof; and at least one optional additive selected from the group of a thermal stabilizer, a thickener, a plasticizer, a toughener, a conductive filler, a dielectric additive, a moisture stabilizer, a curing inhibitor, an adhesion promoter, a storage stabilizer, a colorant, and an organic solvent. The instant setting adhesive composition preferably has a thixotropic index from about 4 to about 6. Additionally, the instant setting adhesive composition preferably has a thermal degradation temperature of about 300° C. or more.

In one embodiment of an instant setting adhesive according to the present invention, the instant setting adhesive composition includes a cyanoacrylic adhesive component including a monomer of the formula:

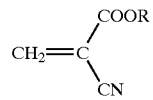

wherein R is selected from the group of a $C_{1-6}$ alkyl, a cycloalkyl, an alkenyl, an alkynyl, a cycloalkenyl, an alkaryl, an aralkyl, and an aryl group. Preferably, R is selected from the group of a methyl group, an ethyl group, an n-propyl group, an isopropyl group, an n-butyl group, an isobutyl group, a pentyl group, a hexyl group, an allyl group, a methallyl group, a crotyl group, a propargyl group, a cyclohexyl group, a benzyl group, a phenyl group, a cresyl group, a 2-chlorobutyl group, a trifluoroethyl group, a 2-methoxyethyl group, a 3-methoxybutyl group and a 2oxyethyl group.

In another embodiment of an instant setting adhesive composition according to the present invention, the instant setting adhesive composition includes a cyanoacrylate adhesive component comprising a monomer of the formula:

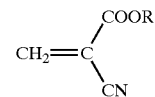

wherein R is selected from the group of a $C_{1-6}$ alkyl, a cycloalkyl, an alkenyl, an alkynyl, a cycloalkenyl, an alkaryl, an aralkyl, and an aryl group; and at least one optional additive selected from the group of a thermal stabilizer, a thickener, a plasticizer, a toughener, a conductive filler, a dielectric additive, a moisture stabilizer, a curing inhibitor, an adhesion promoter, a storage stabilizer, a colorant, and an organic solvent. Preferably, the instant setting adhesive composition has a thixotropic index from about 4 to about 6. Additionally, the instant setting adhesive composition preferably has a thermal degradation temperature of about 300° C. or more.

Yet another aspect of the present invention provides a method for use in packaging a die. Preferably, the method includes the steps of providing a die; providing a leadframe; and using an instant setting adhesive composition to attach the one or more dice to a portion of the leadframe. Preferably, the instant setting adhesive composition includes an adhesive component selected from the group of a cyanoacrylate adhesive, an anaerobic acrylic adhesive, and mixtures thereof and further wherein the instant setting adhesive composition has a thixotropic index from about 4 to about 6.

Preferably, the die includes the instant setting adhesive composition applied thereon. The instant setting adhesive composition can be applied on a variety of portions including at least a portion of the leadframe; a back surface of the die; and at least a portion of a face surface of the die, which can be exposed die bond pads.

Another aspect of the present invention provides a method for use in packaging a die. Preferably, the method includes the steps of providing a die; providing a leadframe; and using an instant setting adhesive composition to attach the one or more dice to a portion of the leadframe under pressure and a temperature of about 200° C. or less.

The methods according to the present invention can further include a variety of additional steps. For example, the method can include the steps of using an instant setting adhesive composition comprising a conductive filler to form a heat sink; and attaching the heat sink to a portion of the die or the leadframe, preferably wherein the heat sink is attached to the package. The method can also include applying an encapsulant on portions of the die attached to the leadframe, wherein the encapsulant comprises an instant setting adhesive composition. Likewise, the method can further include using the instant setting adhesive composition comprises attaching a plurality of lead fingers of the leadframe to the die. Preferably, the lead fingers include the instant setting adhesive composition applied on at least a portion thereof. The method may also further include the step of using the instant setting adhesive composition comprises attaching the die to a mounting paddle. Preferably, the mounting paddle includes the instant setting adhesive composition applied on at least a portion thereof.

Additionally, the methods may further include the step of applying an encapsulant on portions of the die attached to the leadframe. Preferably, the encapsulant includes an instant setting adhesive composition. The method may also include the step of using the instant setting adhesive composition comprises attaching a plurality of lead fingers of the leadframe to the die, wherein the lead fingers include the instant setting adhesive composition applied on at least a portion thereof.

Yet another aspect of the present invention provides a method for attaching a semiconductor die to a leadframe. The method includes providing an instant setting adhesive composition including an adhesive component selected from the group of a cyanoacrylate adhesive, an anaerobic acrylic adhesive, and mixtures thereof and, preferably, applying the instant setting adhesive composition on at least a portion of a wafer including a plurality of dice. The method also includes the steps of singulating dice from the wafer, and attaching a die having the instant setting adhesive composition applied on at least a portion thereof to a portion of a leadframe. The method may also include the step of attaching the die on a portion of the leadframe. Preferably, attaching the die on a portion of the leadframe includes positioning a portion of the die having the instant setting adhesive composition thereon adjacent to the portion of the leadframe; and applying pressure at an elevated temperature to attach the die to the leadframe. More preferably, the elevated temperature is about 200° C. or less.

A further aspect of the present invention provides a method for attaching a semiconductor die to a leadframe. Preferably, the method includes dispensing an instant setting adhesive composition on the leadframe, wherein the instant setting adhesive composition includes an adhesive component selected from the group of a cyanoacrylate adhesive, an anaerobic acrylic adhesive, and mixtures thereof. The method also includes placing the die in contact with the instant setting adhesive composition; and forming a bond between the die and the leadframe with the instant setting adhesive composition. The method may also include the additional step of applying a catalyst to the leadframe, die or to the instant setting adhesive composition prior to forming the bond between the die and the leadframe. In the method, the leadframe may be a mounting paddle or a lead-on-chip leadframe.

Yet a further aspect of the present invention provides a method for attaching a semiconductor die to a leadframe including the steps of providing the leadframe with a mounting paddle and dispensing an instant setting adhesive composition on the mounting paddle. The method also includes placing a die in contact with the instant setting adhesive composition; and applying pressure at a temperature of about 200° C. or less to bond the die to the leadframe with the instant setting adhesive composition.

Another aspect of the present invention provides a method for attaching a lead-on-chip semiconductor die to a lead-on-chip leadframe. Preferably, the method includes providing the leadframe with a plurality of lead fingers configured to form a die mounting area and dispensing an instant setting adhesive composition on the lead fingers in the die mounting area, said adhesive material comprising an adhesive component selected from the group of a cyanoacrylate adhesive, an anaerobic acrylic adhesive, and mixtures thereof and an electrically insulating filler. The method also includes the steps of placing the die in contact with the instant setting adhesive composition; and forming a bond between the die and the lead fingers with the instant setting adhesive composition. Preferably, the method further includes the step of applying a catalyst to the lead fingers, die or the instant setting adhesive composition prior to the placing step.

In the methods according to the present invention above, the dispensing step preferably includes a method selected from the group consisting of screen printing, depositing and patterning, syringe applying, stenciling, dip coating, spraying, dot shooting, and combinations thereof. Alternatively, the step of dispensing the adhesive material includes forming a pattern of dots.

The present invention also provides a semiconductor package including one or more leads; a die including one or more die bond pads electrically connected to the one more leads; and an adhesive layer between at least a portion of the one or more leads and the die, the adhesive layer formed from an instant setting adhesive composition. The adhesive layer can be between a back side of the die and the at least one portion of the one or more leads or between a face side of the die and the at least one portion of the one or more leads. Preferably, the face of the die includes at least one bond pad connected to the one or more leads. Additionally, the semiconductor package may also include a heat sink attached to a portion of the die, wherein the heat sink is formed from an instant setting adhesive composition. The heat sink may be attached to a portion of the package.

Another aspect of the present invention provides a semiconductor package including a singulated portion of a leadframe including a mounting paddle and a plurality of trimmed lead fingers; a die; and an instant setting adhesive composition attaching the die to the mounting paddle.

Yet another aspect of the present invention provides a semiconductor package including one or more leads; a die including bond pads electrically connected to a portion of the one or more leads; and an adhesive layer between at least a portion of the one or more leads and the semiconductor die. Preferably, the adhesive layer is formed from an instant setting adhesive composition including a cyanoacrylate adhesive component comprising a monomer of the formula:

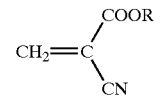

wherein R is selected from the group of a $C_{1-6}$ alkyl, a cycloalkyl, an alkenyl, an alkynyl, a cycloalkenyl, an alkaryl, an aralkyl, and an aryl group; and at least one optional additive selected from the group of a thermal stabilizer, a thickener, a plasticizer, a toughener, a conductive filler, a dielectric additive, a moisture stabilizer, a curing inhibitor, an adhesion promoter, a storage stabilizer, a colorant, and an organic solvent. Preferably, the instant setting adhesive composition has a thixotropic index from about 4 to about 6. Additionally, the instant setting adhesive composition preferably has a thermal degradation temperature of about 300° C. or more.

The semiconductor packages in accordance with the present invention may also include an encapsulant formed from a composition comprising a component selected from the group of a cyanoacrylate adhesive, an anaerobic acrylate adhesive, and mixtures thereof.

These and other objects, features and advantages of the present invention will be apparent from the following description of various embodiments and as illustrated in the accompanying figures.

BRIEF DESCRIPTION OF THE DRAWINGS

FIG. 1A is a schematic plan view with parts removed from a leadframe having a semiconductor die attached thereto in accordance with the present invention;

FIG. 1B is a cross sectional view taken along section line 1B—1B in FIG. 1A illustrating a semiconductor package constructed in accordance with the present invention;

FIG. 2A is a schematic plan view of a semiconductor die illustrating one preferred applying pattern of an adhesive composition in accordance with the present invention;

FIG. 2B is a schematic plan view of a mounting paddle of a leadframe illustrating another applying pattern of an adhesive composition in accordance with the present invention;

FIG. 3 is a schematic block diagram of a system adapted to perform one preferred embodiment of a method in accordance with the present invention;

DETAILED DESCRIPTION OF THE PREFERRED EMBODIMENTS

Adhesive Composition

Figure 4:
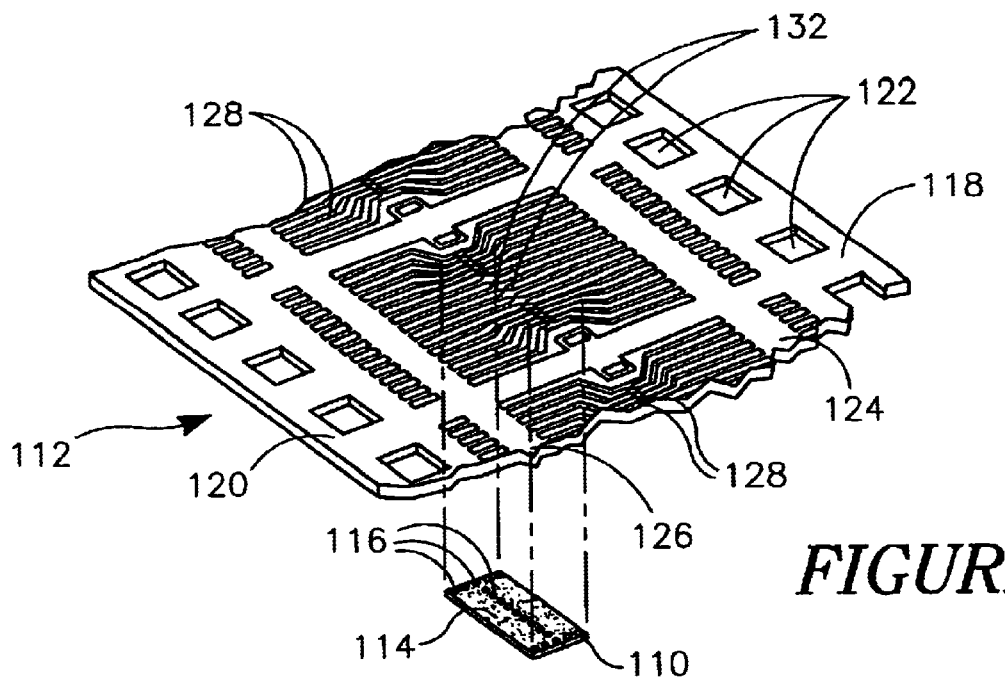
FIG. 4 is an exploded perspective view of a LOC leadframe with an LOC die in accordance with the present invention.

One preferred adhesive composition comprises an instant setting adhesive composition. As used herein, the term "instant setting" refers to the time required for the adhesive composition, once it is applied to a surface, become non-flowable such that the adhesive composition retains the discrete pattern in which it was applied. In general, the time required for the adhesive composition to set is about 0.10 seconds to about 120 seconds. Preferably, the adhesive composition is instant setting at a temperature from about 20° C. to about 30° C. and at ambient atmosphere. More preferably, the time for the adhesive composition to become non-flowable is about 0.10 seconds to about 60 seconds. Thus, an instant setting adhesive composition does not require additional energy input, such as heat or radiation (e.g., ultraviolet light or electronic beam radiation), for application of the adhesive composition to a surface of a substrate. As used herein, "cure" or "cured" refers to a state of an adhesive composition wherein sufficient crosslinking, chain extending, or both (also referred to herein as "polymerization"), has occurred such that a useful bond can no longer be formed with the adhesive composition. In contrast, and in general, thermoplastic materials are typically heated to soften the thermoplastic material for application to a surface. Upon cooling to room temperature, the softened thermoplastic material typically returns to its original condition. Additionally, theromsetting materials are those that cure irreversibly upon heating.

An instant setting adhesive composition according to the invention includes an adhesive component selected from the group of a cyanoacrylate adhesive; an anaerobic acrylic adhesive; and mixtures thereof. A preferred instant setting adhesive composition comprises a cyanoacrylate adhesive component. In general, cyanoacrylate based adhesive compositions are a one part system which obviates the need for metering and mixing additional components for polymerization or curing of the adhesive composition. Cyanoacrylate based adhesive compositions generally do not require the presence of organic solvents which eliminates the time, expense and potential environmental hazards posed by convention adhesive compositions containing organic solvents that must be evaporated during polymerization or curing. Thus, cyanoacrylate adhesive compositions are typically substantially totally reactive. Other advantageous characteristics include high bond strength formed after polymerization or curing and solvent resistance of the polymerized adhesive composition.

A cyanoacrylate adhesive composition preferably includes a monomer having the following general formula:

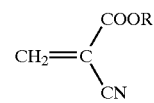

in R is selected from the group of a $C_{1-6}$ alkyl, cycloalkyl, alkenyl, alkynyl, cycloalkenyl, alkaryl, aralkyl, or aryl group. Optionally, any of the above listed groups may be substituted with a nonbasic group, such as oxo, halo, silicon, and ether oxygen, so long as these substitutions do not interfere with the stability and adhesion of the adhesive composition. Preferable R groups are selected from the group of a methyl group, an ethyl group, an n-propyl group, an isopropyl group, an n-butyl group, an isobutyl group, a pentyl group, a hexyl group, an allyl group, a methallyl group, a crotyl group, a propargyl group, a cyclohexyl group, a benzyl group, a phenyl group, a cresyl group, a 2-chlorobutyl group, a trifluoroethyl group, a 2-methoxyethyl group, a 3-methoxybutyl group and a 2-ethoxyethyl group. Cyanoacrylate adhesives are commercially available from Loctite Corporation, Rocky Hill, Conn., for example, under the trade designations 410 and 416.

Another preferred instant setting adhesive composition includes an anaerobic acrylic adhesive component An anaerobic adhesive compositions are those that cure in the absence of oxygen, even in the absence of oxygen in the ambient atmosphere. Typically, anaerobic adhesive compositions cure in the presence of a metal and exposure to free radicals. More preferred anaerobic adhesive compositions include low molecular weight polyfunctional methacrylates, such as described in U.S. Pat. No. 4,309,526 (Baccei).

Thixotropic Characteristic

Conventional instant setting adhesive compositions typically do not possess sufficient thixotropic characteristics for semiconductor applications, such as packaging assembly, particularly when the semiconductor application is automated. Preferably, an instant setting adhesive composition in accordance with the invention has a thixotropic characteristic such that the adhesive composition can be dispensed in a discrete pattern. By "discrete pattern," it is meant that after the adhesive composition is dispensed in a desired configuration, the adhesive composition substantially maintains the configuration in which it was applied without the need for any additional barriers or steps to prevent the borders of individual adhesive composition portions from mingling thus, renewing the configuration indeterminate. Preferably, applying the adhesive composition is accomplished by a method selected from the group consisting of screen printing, depositing and patterning, syringe applying, stenciling, dip coating, spraying, dot shooting, and combinations thereof. Alternatively, the step of dispensing the adhesive material includes forming a pattern of dots.

One preferred way to determine the thixotropic characteristic is by a thixotropic index. As used herein, "thixotropic index" is defined as a viscosity measurement taken at a spindle speed of 0.5 rpm divided by a viscosity measurement taken at a spindle speed of 5 rpm. Viscosity measurements are generally determined by employing a Brookfield Viscometer, for example, model HBDV-II, from Brookfield Engineering Lab, Inc., Stoughton, Mass., and a CP-51 spindle under ambient conditions (i.e., room temperature). It will be appreciated that a thixotropic index determined for a given composition changes when viscosity measurements are determined at different spindle speeds. Additionally, one composition cannot be directly compared to another composition when the thixotropic indices are determined at different spindle speeds. While not wishing to be bound by any particular theory, it is believed this is due, in part, to the shear conditions to which a composition is subjected during viscosity measurement determination. In general increasing spindle speed tends to decrease viscosity in a non-linear fashion and thus, viscosity plotted against increasing spindle speed generates a unique viscosity profile which characterizes that composition. Preferably, an adhesive composition in accordance with the present invention has a thixotropic index from about 4 to about 6 and a viscosity of about 40,000 cps at 5 rpm.

A thixotropic index of an adhesive composition according to the invention may be increased by the addition of a thixotropic additive that increases the thixotropic index without altering the viscosity and adversely affecting other properties of the adhesive composition, such as the cure time, conductivity, stability, etc. Preferably, the thixotropic additive is selected from the group of polydimethylsiloxane treated silica, a trialkoxyalkylsilane treated silica, and mixtures thereof. The silica may either be fumed or fused silica. Examples of commercially available thixotropic additives include polydimethylsiloxane treated silica, available under the trade designation CAB-O-SIL N70TS, from Cabot Corporation, Boston, Mass.; and trialkoxyalkylsilane treated silica, available under the trade designation AEROSIL R805, available from Degussa Corporation, Ridgefield Park, N.J.

Optional Additives

As mentioned above, conventional instant setting adhesive compositions are typically not formulated for electronics packaging. According to the present invention, instant setting adhesive compositions can be modified to achieve the desired properties and characteristics necessary for electronics packaging processes with various optional additives. Such optional additives are added to improve the thermal stability, mechanical durability, electrical conductivity, dielectric strength, moisture resistivity, or other characteristics of the adhesive composition for a particular packaging application.

Accordingly, an adhesive composition of the present invention preferably includes at least one optional additive selected from the group of a thermal stabilizer, a thickener, plasticizer, a toughener, a conductive filler, a dielectric additive, a moisture stabilizer, a curing inhibitor, an adhesion promoter, a storage stabilizer, a colorant (e.g., a pigment or a dye), an organic solvent, and mixtures thereof. Regardless of the number of optional additives included in an instant setting adhesive composition, the total amount of the optional additive can be about 85% by weight or less based on the total weight of the adhesive composition, depending upon the desired application for the instant setting adhesive composition. For example, in wafer level LOC applications the total amount of the optional additive is about 20% by weight or less based on the total weight of the adhesive composition.

1. Thermal Stability

Preferably, an instant setting adhesive composition suitable for use in semiconductor applications has a thermal degradation temperature sufficiently high enough so that thermal decomposition of the cured adhesive is inhibited when substrates bonded together are in use. More preferably, an instant setting adhesive composition has a thermal degradation temperature of about 300° C. or more. Also preferably, an instant setting adhesive composition has a glass transition temperature of about 180° C. or more.

In order to increase the thermal stability of an instant setting adhesive composition, a thermal stabilizer can be added to the adhesive composition. Preferably, the thermal stabilizer is a compound selected from the group of an alkyl 2-cyano-2,4-pentadienoate; an alkyl 2-cyano-2,4-hexadienoate; an itaconic anhydride (e.g., U.S. Pat. No. 3,984,749 to Konigm); a maleic anhydride (e.g., U.S. Pat. No. 3,832,334 to O'Sullivan, et al.); a substituted napthasultone (e.g., U.S. Pat. No. 5,424,343 to Attarwala); a di-$\alpha$-cyanopentadienoate disiloxane (e.g., U.S. Pat. No. 5,386,047 to Nakos et al.); a sulfur-containing compound such as a sulfoxide, a sulfotate, a sulfinate, etc. (e.g., U.S. Pat. No. 5,328,944 to Attarwala et al.), an aromatic compound substituted with at least three electron withdrawing groups (e.g., U.S. Pat. No. 5,288,794 to Attarwala); a bifunctional monomer (e.g., a (meth)acrylic acid ester, an aliphatic polyol, an aromatic polyol, to name a few); an unsaturated ester of 2-cyanorylic acid (e.g., U.S. Pat. No. 3,142,698 to Benjamin et al., and U.S. Pat. No. 3,825,580 to Kato et al.); and mixtures thereof. Other thermal stabilizers can optionally be added to increase the thermal degradation temperature, glass transition temperature or both and can be selected from the group of $SiO_2$, $Al_2O_3$, AlN, Ag, Ni, Fe, and mixtures thereof.

An instant setting adhesive composition according to the invention is also suitable for use for attachment of heat sinks or as a heat sink itself. In these situations, it is desirable that the instant setting adhesive composition, a particularly preferred thermally conductive filler is silica coated aluminum nitride such as that commercially available under the trade designation SCAN, from Dow Chemical, Midland Mich., and boron nitride, which is readily commercially available from a variety of sources.

2. Mechanical Durability

Mechanical durability of an instant setting adhesive composition may be improved by including a thickener, a plasticizer, and a toughener in an instant setting adhesive composition according to the invention. A thickener may be added to increase viscosity of an instant setting adhesive composition. For example, a thickener is particularly desirable to include in an instant setting adhesive composition including a cyanoacrylate adhesive component because this type of adhesive composition typically has a viscosity of only about 10 to about 100 centipoises. However, a higher thixotropic index and a higher viscosity are desired for certain dispensing techniques, such as screen printing. Preferred thickeners are polymeric additives including, but not limited to, poly(methyl) methacrylate, methacrylate-type copolymers, acrylic rubbers, cellulose derivatives, polyvinyl acetate, and poly($\alpha$-cyanoactylate).

A plasticizer may be added to an instant setting adhesive composition in accordance with the present invention. The addition of a plasticizer is preferably included when it is desired to improve the aging characteristics of the adhesive composition after it is cured to decrease the brittleness. A plasticizer is preferably selected from the group of monofunctional and functional aliphatic esters of acids containing from 1 to about 10 carbon atoms. Examples of such plasticizers include dimethyl octyl sebacate and esters of malonic acid, difunctional aromatic esters, phosphates and phosphonates.

A toughener may also be added to an adhesive composition. Typically, tougheners are polymeric additives and, are more preferably, selected from the group of acrylic elastomers, acrylonitrile copolymer elastomers, fluoro elastomers, and mixtures thereof. If used in sufficient amount, these polymeric additives may also serve as a thickener.

Mechanical strength may also be improved by including $SiO_2$ and SiC in an instant setting adhesive composition of the invention.

3. Electrical Conductivity

Electrical conductivity may be improved by including a conductive filler in an instant setting adhesive composition according to the invention. Examples of conductive filers include Ag, Ni, and Pd. An electrically conductive filled instant setting adhesive composition is typically required for applications such as for interconnect device backside conductivity or for wire bond monitoring system (WBMS).

4. Dielectric Property

Because an instant setting adhesive composition according to the invention is suitable for attachment of a die to a leadframe, for example, it is desirable that the instant setting adhesive composition possess a dielectric constant of about 4 or less. Additionally, an instant setting adhesive composition is also suitable for use as an encapsulant. Dielectric strength may be increased by including $SiO_2$ or fluorinated polyimide in an instant setting adhesive composition according to the invention.

5. Moisture Resistivity

When desirable, a moisture stabilizer may be added to an instant setting adhesive composition according to the invention to improve adhesion function in increased humidity. This is particularly desirable when the ambient atmosphere has a high moisture content because instant setting adhesive compositions including a cyanoacrylate adhesive component tend to easily cure anionically in the presence of trace amounts of moisture. One preferred moisture stabilizer that can be added to an instant setting adhesive composition is an ester, wherein an alcohol residue of the ester contains a dipentaerythritol residue and an acid residue of the ester is an acrylic acid residue or a methacrylic acid residue, for example, as described in U.S. Pat. No. 5,536,799 (Takahashi et al.). Another preferred moisture stabilizer that can be added to an instant cure adhesive composition is a monomeric fluorinated ether of dimethylvinylethynylcarbinol, such as that described in U.S. Pat. No. 4,167,546 (Korshak, et al.).

6. Adhesive Stabilization

Other characteristics that may be altered arm the adhesion of the substrates and the rate of cure. Thus, optional additives can further include an adhesion promoter and a storage stabilizer.

An adhesion promoter can either be added to an instant setting adhesive composition according to the invention or it can be applied to the surface of the substrate to be adhered prior to the application of the instant setting adhesive composition. For example, an adhesion promoter can be applied to a surface of the die 10 or a surface of the mounting paddles 12 to accelerate curing of the adhesive layer 20 (FIG. 1B). Suitable adhesion promoters include deionized (DI) waler, 3,4,5-trihydroxybenzoic acid and esters thereof (e.g., U.S. Pat. No. 4,139,693 to Schoenberg); and a quaternary ammonium compound having nitrogen bonded pendant $C_1$–$C_{22}$ alkyl or hydroxyalkyl groups, such as those described in U.S. Pat. No. 5,079,098 (Liu).

Storage (or adhesive) stabilizers may also be used to stop polymerization at a desired thickness, at a gap between the bonded surfaces, or during storage of bulk instant setting adhesive compositions. Suitable adhesive stabilizers are generally either anionic polymerization inhibitors or free radical inhibitors. Suitable anionic polymerization inhibitors typically have a $pK_a$ of about 4 or less and are usually acids, or anhydrides thereof. Examples of useful anionic polymerization inhibitors include sulfur dioxide, nitric acid, hydrogen fluoride, hydrochloric acid, sulfuric acid, phosphoric acid, sulfonic acid, carboxylic acid, acetic acid, carboxylic acid anhydrides, phosphoric acid anhydrides, sultones, acid chlorides, and the like.

Suitable free radical inhibitors include phenolic compounds such as quinone, hydroquinone, t-butyl catechol, p-methoxyl-penol, and the like.

7. Other Optional Additive

Other optional additives that may be included in the adhesive composition of the present invention include a colorant (e.g., a pigment or a dye) as is known in the art.

Packaging Applications

Referring to FIGS. 1–2, packaging using a leadframe having mounting paddles is described. In this packaging method, an instant setting adhesive composition is applied in-line, as described below. A semiconductor die 10 is shown attached to a leadframe 14 in accordance with the present invention. As previously described, the leadframe is typically adapted to mount a plurality of dice. A semiconductor die 10 includes a pattern of bond pads 18 in electrical communication with the integrated circuits of the die 10. The leadframe 14 comprises a conventionally formed metal leadframe having mounting paddles 12 and paddle support bars 13. In addition, the leadframe 14 includes an arrangement of lead fingers 16. Wires 15 are bonded to the bond pads 18 on the die 10 and to bonding sites on the lead fingers 16 to form separate electrical paths therebetween.

FIG. 1B illustrates a semiconductor package 17 after singulation from the leadframe 14. As shown in FIG. 1B, the package 17 includes the die 10, which has been attached to the mounting paddle 12 using a cured adhesive layer 20. Further details of the attachment process will be hereinafter described. The semiconductor package 17 also includes a plastic encapsulant 19 which encapsulates the die 10 and portions of the lead fingers 16A. Leads 16A for the package 17 comprise trimmed and formed portions of the lead fingers 16 (FIG. 1A). Additionally, the semiconductor package 17 may include a heat sink for dissipating heat generated in the device during operation. A heat sink 31a may be included within the encapsulant 19 in close proximity to the die 10. Alternatively, a heat sink 31b may be included on a surface of the encapsulant 19.

Preferably, the method of the invention is practiced using an instant setting adhesive composition including an adhesive component selected from the group of a cyanoacrylate adhesive, an anaerobic acrylic adhesive, and mixtures thereof, as described above. The adhesive composition can be applied by any suitable in-line applying mechanism including screen printing, syringe applying, stenciling, dip coating, spraying, and dot shooting mechanisms. A total volume of the adhesive composition applied to the leadframe 12 (or to the die 10) is dependent on the size of the die 10 and a desired thickness of the adhesive layer 20 (FIG. 1B). A representative total volume of adhesive composition for a 4.4 mm×9.4 mm die is preferably from about 0.0025 grams to about 0.0011 grams. The resultant adhesive layer 20 (FIG. 1B) preferably has a thickness from about 0.25 mils to about 2 mils.

Preferably, immediately subsequent to applying the instant setting adhesive composition on the mounting paddles 12 (or alternately on the die 10), the die 10 can be placed in contact with the adhesive composition. The applying and placing steps can be performed using a system 22, which is shown schematically in FIG. 3. This illustrative system 22 can include components of a conventional die attach machine configured for polymer bonding of die to leadframes. One suitable die attach machine is manufactured by ESC Manufacturing Company of Ivy Land, Pa., and is designated a Model No. 9200. It will be recognized by one skilled in the art that alternate system configurations may be used to carry out the processes described herein.

The system 22 can include a leadframe feed mechanism 42 for manipulating the leadframes 14, and a vacuum tool 44 for manipulating the die 10. In addition, the system 22 can include a applying mechanism 46 for applying a desired volume of instant setting adhesive composition to the mounting paddles 12 (FIG. 1A) of the leadframes 14.

The system 22 can also include an optical alignment device 48 for aligning the die 10 to the mounting paddles 12. Still further, the system 22 can include a die support platform 50 for placing the die 10 in contact with the mounting paddles 12 with a required pressure. Preferably, this pressure can be in the range of 75 to 100 gm/die. The pressure is generally applied in conjunction with heat. According to the present invention, a bonding temperature is preferably about 200° C. or less. This bonding temperature is somewhat less that what is applied when conventional thermoplastic adhesive compositions are used. Conventional thermoplastic adhesive compositions typically utilize a bonding temperature of about 300° C. or more.

Curing or polymerizing the instant setting adhesive composition initiates when the die 10 is placed in contact with the instant setting adhesive composition on the mounting paddles 12. With the adhesive sandwiched between the die 10 and mounting paddles 12, a small amount of moisture contained on the mounting paddles 12 at the bonding temperature is generally sufficient to initiate anionic polymerization of the instant setting adhesive to form the cured adhesive layer 20 (FIG. 1B). Curing of the instant setting adhesive composition is preferably completed in a period of time from about 1 second or less. In this manner, the semiconductor die 10 can be bonded to leadframe 14 without heating the die 10 or leadframe 14. The adhesive layer 20 (FIG. 1B) formed in this manner is sufficiently strong to withstand conditions to which die will be exposed to during use in electronic equipment.

Additionally, an instant setting adhesive composition of the present invention may be used to attach the heat sink 31a or 31b or it may form the heat sink itself. In either instance, it is preferable that the instant setting adhesive composition possess suitable thermal stability characteristics, as described above. The system 22 (FIG. 3) may include a mechanism for applying the instant setting adhesive composition prior to application of the heat sink or to form the beat sink, as desired.

Figure 5:
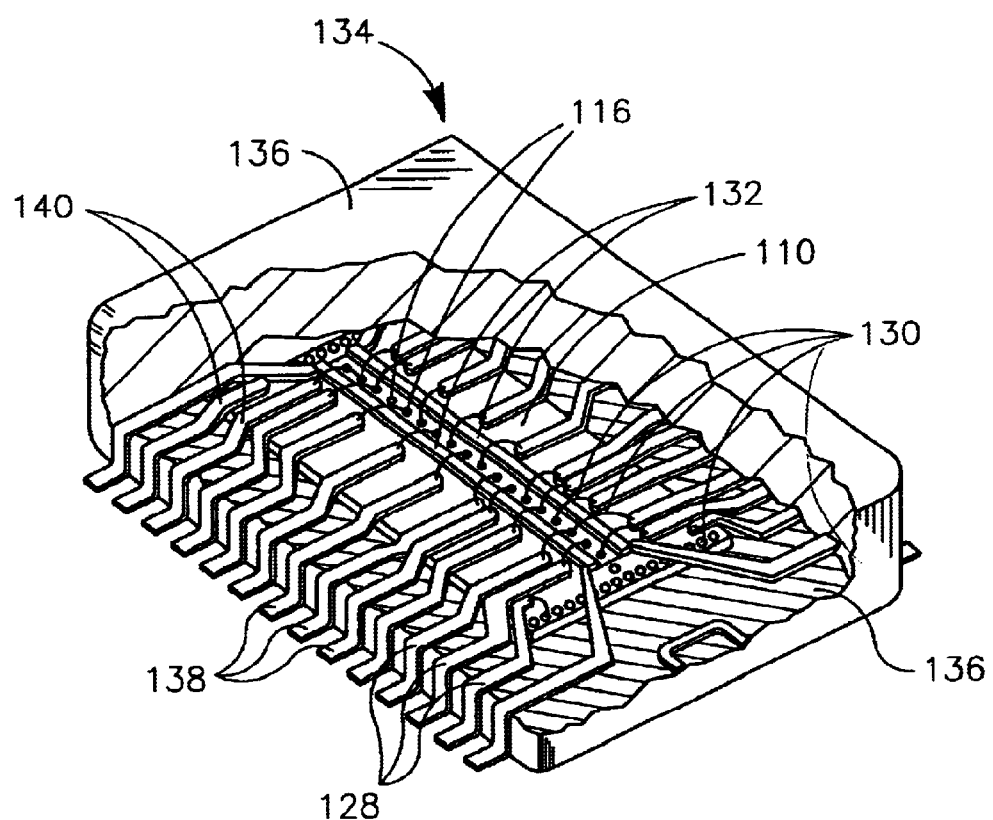
FIG. 5 is a perspective view of a packaged LOC die in accordance with the present invention.

Referring to FIGS. 4 and 5, another packaging application using an instant setting adhesive composition applied in-line is described. A lead-on-chip (LOC) die 110 and a lead-on-chip (LOC) leadframe 112 are shown. The LOC die 110 is thin, flat, and generally rectangular in shape and includes a die face 114, or active side, wherein the integrated circuitry is formed. A plurality of die wire bonding pads 116 are formed across the center and side edges of the die 10 in electrical contact with the integrated circuitry of the die 110.

The leadframe 112 is formed from metal sheet and includes side rails 118, 120 formed with indexing holes 122. The indexing holes 122 facilitate transport and indexing of the leadframe 112 by automated packaging machinery. The leadframe 112 also includes sidebars 124, 126 (or dambars) for increased rigidity and to limit the flow of encapsulating material during the enepsulation process. The side rails 118, 120 and sidebars 124, 126 are trimmed away during a trim and form operation.

Furthermore, the leadframe 112 includes a plurality of generally parallel and spaced lead fingers 128. During the packaging process, the die 110 is attached to at least a portion of the lead fingers 128. Attachment is accomplished using an instant setting adhesive composition as described herein. The instant setting adhesive composition may be applied to portions of the leadfingers 128 or to portions of a face of the die 110 resulting in a cured layer between the portions of the die 110 and portions of the lead fingers 128.

The lead fingers 128 are connected to thin bond wires 130 (FIG. 5), which also connect to the wire bond pads 116. The lead fingers 128 thus function to electrically connect the integrated circuitry of the LOC die 110 to external circuitry (e.g., a printed circuit board). In addition, the lead fingers 128 function to support the LOC die 110 during the packaging process and to facilitate beat transfer from the LOC die 110. The leadframe 112 also includes bus bars 132 for making multiple connections to the wire bond pads 116.

Referring to FIG. 5, the packaged LOC die 110 or semiconductor package (or module) 134 is shown. The semiconductor package 134 includes an encapsulating material 136 which encapsulates the chip 110 and all but a terminal portion 138 of the lead fingers 128. Kinks 140 in the lead fingers 128 help to strengthen the assembly. The encapsulating material 136 may be formed from an instant setting adhesive composition, as described above. The LDC die 110 is located in the center of the package 134 with the wire bond pads 116 of the die 110 connected to the thin bond wires 130, which in turn connect to the lead fingers 128. Portions of the lead fingers 128 are attached to the front side 114 of the die 110, or to an alpha barrier (not shown) attached to the die 110 using an instant setting adhesive composition. Prior to encapsulation, the lead fingers 128 provide the only physical connection between the leadframe 112 and the LOC die 110. In a lead-under-chip (LUC) device, packaging may be accomplished by applying an instant setting adhesive composition in-line to at least portions of a back side of the die or to portions of the lead fingers to which the die is attached.

Referring now to FIGS. 6–12, a semiconductor wafer 142 including an instant setting adhesive composition 146 dispensed thereon and packages resulting therefrom, in accordance with the invention are described. The wafer 142 is manufactured for producing a plurality of dice 144 using various techniques which are known in the art. In accordance with the method of the invention, a first side of the wafer 142, shown as a front side 150 of the wafer 142, is coated with an instant setting adhesive composition 146. Deposition of the adhesive composition 146 may, for example, follow the deposition of a final insulating/passivating layer on the wafer 142. Alternately, as shown in FIG. 10B, the back side 151 of the wafer 142 may also be coated with an instant setting adhesive composition 146 for lead-under-chip (LUC) die bonding, conventional die bonding, or as an adhesive interface for chip stacking.

The present invention includes applying an instant setting adhesive composition on at least a portion of a wafer, singulating dice from the wafer, and attaching a die to at least a portion of a leadframe. Further, the instant setting adhesive composition is applied on a first surface of a semiconductor wafer in a configuration wherein a plurality of portions having the instant setting adhesive composition dispensed thereon are separated by zones that are essentially free of the instant setting adhesive composition. The first surface of the wafer on which the instant setting adhesive composition is dispensed can be a front side of the wafer for attaching lead-on-chip (LOC) dice to a leadframe, or it can be a back side of the wafer for attaching lead-under-chip (LUC) dice to a leadframe (or a mounting paddle) or for chip stacking.

An instant setting composition 146 is preferably dispensed on the wafer 142 (and die 144) with a thickness of between about 8 μm to about 200 μm. The instant setting adhesive composition 146 may be applied to the wafer 142 in a pattern by any suitable deposition method. Preferable application methods are selected from the group of screen printing, deposition and patterning, syringe applying, stenciling, dip coating, spraying, dot shooting, and combinations thereof.

One preferred method is a screen printing process. A screen printing process is similar to a silk screening process used for printing T-shirts and artwork. Such a process is shown schematically in FIG. 11A. With a screen printing process, the wafer 142 is coated with an instant setting adhesive composition 146 dispensed from a nozzle 172. A patterned screen 166 is situated between the wafer 142 and the nozzle 172 to provide the desired pattern. In addition, a dockering roller 168 (or blade), movably mounted for motion across the screen 166, as indicated by arrow 170, can be used to aid in the distribution of the adhesive.

Another preferred method is a stenciling process. A stenciling process is shown schematically in FIG. 11B. In a stenciling process, a stencil 167 is placed over the desired surface to be coated with the instant setting adhesive composition. The stencil 167 is about 5 kg of applied force. Heat is also applied at a temperature of about 200° C. or less. Typically, a bond forms in about 1 second or less.

Following attachment of the die 144 and lead fingers 158, 160, fine bond wires 162, 164 can then be attached to the bond pads 154 of the die 144 and to the lead fingers 158, 160 during a wire bonding process. Additionally, any other electrical connecting processes may be used for connection of bond pads to lead finger For example, TAB bonding may be used as opposed to wire bonding.

After wire bonding, an encapsulation process is performed to complete the semiconductor package. An instant setting adhesive may be used to encapsulate the die. The result is a package substantially similar to the package described with reference to FIGS. 4–5. Further, a step of attaching a heat sink (not shown) can be included in a method in accordance with the invention, such as described with reference to FIG. 1B. In one embodiment, attaching a heat sink generally includes applying an instant selling adhesive composition on at least one surface of the die either prior to or after singulation from the wafer and attaching a beat sink thereto. In an alternative embodiment, attaching a heat sink generally includes applying an instant setting adhesive composition on at least one surface of the packaged die or encapsulated package, i.e., the instant setting adhesive composition functions as the heat sink. In either embodiment, the instant setting adhesive composition is thermally conductive. In these applications, the instant setting adhesive composition preferably contains a conductive filler, more preferably a thermally conductive filler, as described above. The heat sink dissipates heat generated when the electronic package is in operation.

In addition to forming an adhesive layer 147 for attaching the die 144 to the lead fingers 158, 160 or a leadframe, an instant setting adhesive composition 146 can also be formulated to function as an additional passivating/insulating layer for the wafer 142 and the die 144. As an example, the instant setting adhesive composition 146 may be formulated to provide complete coverage of the die 144 similar to a die coat for BTMS (bottom to top metal shorts and thin film crack) protection. The instant setting adhesive composition 146 may also be formulated in some applications to function as an alpha barrier. In general, alpha barriers preferably have a melting temperature in excess of 175° C. and do not contain ionizable species such as halides and active metals.

In a further packaging process, an instant setting adhesive composition 174 is applied directly to the lead fingers 176 of a leadframe 178 instead of to the front side of the wafer or die, as previously described. The adhesive composition 174 may be deposited in a pattern that matches the placement of the lead fingers on the die (e.g., just the ends of the lead fingers 176). As an example, the adhesive composition 174 can be dispensed on the lead fingers 176 using a spray on applying system similar to the screen printing process shown in FIG. 12. In addition, an electrostatic charge can be utilized to aid in the distribution of the adhesive composition on the lead fingers 176. This can be accomplished by charging an instant setting adhesive composition and influencing its deposition pattern on the lead fingers 174 using suitably located charge plates.

Further applications will be recognized by those with skill in the art. For example, an instant setting adhesive composition may be used in leadless chip carriers, surface mount carriers, and chip on board modules.

EXAMPLE 1

An instant setting adhesive composition including a cyanoacrylate adhesive monomer commercially available from Lucite Corporation, Rocky Hill, Conn., under the trade designation "416," was applied as a pattern of dots to the mounting of a copper leadframe. A total volume of the adhesive monomer was about 0.005 grams. A semiconductor die having a 3 mm×5.6 mm footprint was manually positioned upon the mounting paddle. Curing occurred within about 10 seconds to form an adhesive layer about 0.2 mils thick. The adhesion force of the resulting bond was measured to be about 1.7 kg. Application and curing of the adhesive was performed at a room temperature of between about 20° C. to 30° C.

EXAMPLE 2

A plurality of semiconductor die having a footprint of 3 mm×5.6 mm were secured to separate mounting paddles of a copper alloy leadframe using a Model No. 9200 die attacher from ESC Manufacturing Company, Warrington, Pa. Different cyanoacrylate adhesive monomers sold by Loctite Corporation, Rozky Hill, Conn., under the trade designations "410" and "416," were applied and cured at a room temperature of from 20° C. to 30° C. A total volume of adhesive was about 0.005 grams applied in various dot patterns to form adhesive layers about 0.2 mils thick. Both adhesives were found to cure in seconds with a bonding force of about 1.7 kg/die.

All patents patent documents, and publications cited herein are incorporated by reference as if each were individually incorporated by reference. Various modifications and alterations of this invention will be apparent to those skilled in the art without departing from the scope and spirit of this invention, and it should be understood that this invention is not limited to the illustrative embodiments set forth herein.

What is claimed is:

1. An instant setting adhesive composition comprising:
   an adhesive component selected from the group of a cyanoacrylate adhesive, an anaerobic acrylic adhesive, and mixtures thereof, wherein the adhesive component comprises a monomer of the formula:

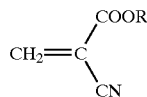

wherein R is selected from the group of alkaryl, a cycloalkenyl, an aralkyl, a 2-chlorobutyl group, a methalkyl group, a crotyl group, and a 2-methoxyethyl group; and
   at least one additive selected from the group of a thermal stabilizer, a thickener, a plasticizer, a toughener, a conductive filter, a dielectric additive, a moisture stabilizer, a curing inhibitor, an adhesion promoter, a storage stabilizer, a colorant, and an organic solvent;
   wherein the instant setting adhesive composition has a thixotropic index from about 4 to about 6.

2. The instant setting adhesive composition of claim 1 wherein the instant setting adhesive composition has a thermal degradation temperature of about 300° C. or more.

3. An instant setting adhesive composition comprising:
   an adhesive component selected from the group of a cyanoacrylate adhesive, an anaerobic acrylic adhesive, and mixture thereof, wherein the adhesive component comprises a monomer of the formula:

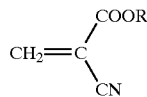

wherein R is selected from the group of a benzyl group and a crotyl group; and at least one additive selected from the group of a thermal stabilizer, a thickener, a plasticizer, a toughener, a conductive filter, a dielectric additive, a moisture stabilizer, a curing inhibitor, an adhesion promoter, a storage stabilizer, a colorant, and an organic solvent;
   wherein the instant setting adhesive composition has a thixotropic index from about 4 to about 6.

4. The instant setting adhesive composition comprising:
   a cyanoacrylate adhesive component comprising a monomer of the formula:

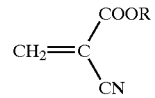

wherein R is selected from the group of an alkaryl, a cycloalkenyl, an aralkyl, a 2-chlorobutyl group, a methalkyl group, and a 2-methoxymethyl group; and at least one additive selected from the group of a thermal stabilizer, a thickener, a plasticizer, a toughener, a conductive filter, a dielectric additive, a moisture stabilizer, a curing inhibitor, an adhesion promoter, a storage stabilizer, a colorant, and an organic solvent;
   wherein the instant setting adhesive composition has a thixotropic index from about 4 to about 6.

5. The instant setting adhesive composition of claim 4 wherein the instant setting adhesive composition has a thermal degradation temperature of about 300° C. or more.

6. The instant setting adhesive composition of claim 4 wherein R is selected from the group of benzyl group and cresyl group.

7. The instant setting adhesive composition of claim 1 wherein the instant setting adhesive composition becomes non-flowable when applied to a surface within about 0.1 to about 120 seconds.

8. The instant setting adhesive composition of claim 1 wherein the instant setting adhesive composition becomes non-flowable when applied to a surface within about 0.1 to about 120 seconds at a temperature of about 20° C. to about 30° C.

9. The instant setting adhesive composition of claim 1 wherein the instant setting adhesive composition becomes non-flowable when applied to a surface within about 0.1 to about 60 seconds.

10. The instant setting adhesive composition of claim 1 wherein the instant setting adhesive composition becomes non-flowable when applied to a surface within about 0.1 to about 60 seconds at a temperature of about 20° C. to about 30° C.

11. The instant setting adhesive composition of claim 1 wherein the instant setting adhesive composition substantially maintains a configuration on a surface upon which the instant setting adhesive composition was applied.

12. The instant setting adhesive composition of claim 4 wherein the instant setting adhesive composition becomes non-flowable when applied to a surface within about 0.1 to about 120 seconds.

13. The instant setting adhesive composition of claim 4 wherein the instant setting adhesive composition becomes non-flowable when applied to a surface within about 0.1 to about 120 seconds at a temperature of about 20° C. to about 30° C.

14. The instant setting adhesive composition of claim 4 wherein the instant setting adhesive composition becomes non-flowable when applied to a surface within about 0.1 to about 60 seconds.

15. The instant setting adhesive composition of claim 4 wherein the instant setting adhesive composition becomes non-flowable when applied to a surface within about 0.1 to about 60 seconds at a temperature of about 20° C. to about 30° C.

16. The instant setting adhesive composition of claim 4 wherein the instant setting adhesive composition substantially maintains a configuration on a surface upon which the instant setting adhesive composition was applied.

* * * * *

UNITED STATES PATENT AND TRADEMARK OFFICE
CERTIFICATE OF CORRECTION

PATENT NO. : 6,699,928 B2
DATED : March 2, 2004
INVENTOR(S) : Cobbley et al.

It is certified that error appears in the above-identified patent and that said Letters Patent is hereby corrected as shown below:

Column 3,
Line 24, please insert a -- . -- after "composition";
Line 24, please start a new paragraph after "adhesive composition." Starting the new paragraph with -- Another aspect of the present… --;

Column 4,
Lines 5-6, please delete "2oxy-ethyl" and insert -- 2-ethoxyethyl --;

Column 8,
Line 47, please delete "nonbasic" and insert -- non-basic --;

Column 15,
Line 62-64, please delete "about 5 kg of applied force. Heat is also applied at a temperature of about 200º C. or less. Typically, a bond forms in about 1 second or less." and insert, --typically a rigid structure having a pattern therein and can be formed from a variety of conventional materials that do not chemically react with screen printing paste. The pattern included in the stencil 167 includes a plurality of apertures 177 separated by solid portions (not labeled) of the stencil, wherein the plurality of apertures correspond to the desired location for dispensing the instant setting adhesive composition on the die 144. A quantity of the instant setting adhesive composition 146' is dispensed on a solid portion of the stencil 167, although the exact amount of the instant setting adhesive composition is not critical. A flexible blade 175 is positioned near the quantity of the instant setting adhesive composition 146'. The flexible blade 175 moves in one direction, shown for example as arrow A so as to pull the quantity of the instant setting adhesive composition against the stencil. Thus, it is similar in operation to that of a squeegee. As the flexible blade 175 is drawn over the surface of the stencil 167, a portion of the instant setting adhesive composition 146' falls through the plurality of apertures 177 to form a layer of instant setting adhesive composition 146 in the discrete pattern corresponding to the plurality of apertures 177 in the stencil 167. Accordingly, because the instant setting adhesive composition can be

UNITED STATES PATENT AND TRADEMARK OFFICE
CERTIFICATE OF CORRECTION

PATENT NO. : 6,699,928 B2
DATED : March 2, 2004
INVENTOR(S) : Cobbley et al.

It is certified that error appears in the above-identified patent and that said Letters Patent is hereby corrected as shown below:

Column 15 (cont'd), applied at room temperature and sets to form a discrete pattern, stenciling is an advantageous method of application because special heating equipment is not required to apply the instant setting adhesive composition.

Furthermore, an instant setting adhesive composition could be deposited and patterned using a resist pattern with a solvent. This is sometimes referred to as a resist etch back. In general, such a resist etch back would involve patterning the adhesive composition with a patterned resist layer and then removing the resist with a suitable solvent, leaving the patterned instant setting adhesive composition.

Figure 6:
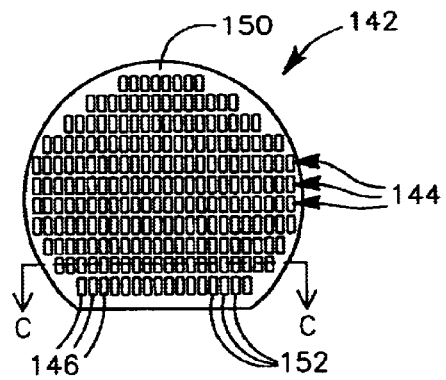
FIG. 6 is a plan view of a semiconductor wafer with a patterned adhesive composition applied thereon in accordance with the present invention.
Figure 7:
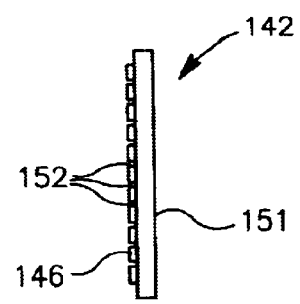
FIG. 7 is a side elevation view taken across line C—C of the semiconductor wafer shown in FIG. 6.

Following or during the adhesive deposition process, the adhesive composition 146 is patterned such that streets (or zones) 152 are formed between the individual dice 144, such as by the methods described above. This is particularly useful for singulating the dice 144, e.g. saw cutting the dice. Preferably, these zones 152 are substantially free of adhesive 146, as shown in Figures 6 and 7. These streets 152 are also variously known in the art as scribe lines, saw lines, or avenues. With the streets 152 free of adhesive, the efficiency of the saw cutting procedure is unaffected by the adhesive layer 146. It is to be understood, however, that the invention can be practiced with adhesive located in the streets 152.

Figure 8:
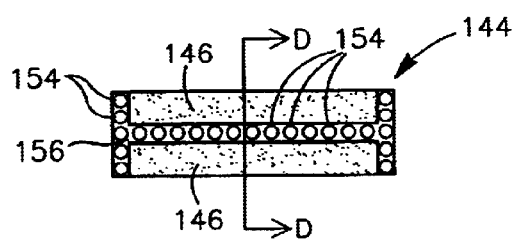
FIG. 8 is a plan view of an LOC die separated from the wafer of FIG. 6 and having an adhesive composition applied in accordance with the present invention.

With respect to LOC packaging processes as shown at least in part in Figures 8-10A, in addition to the streets 152 preferably being essentially free of adhesive, the adhesive layer 146 is patterned such that the bond pads 154 (Fig. 8) for the dice 144 are also free of adhesive. As shown in Figure 8, this may be accomplished by patterning a substantially adhesive free area 156 around the bond pads 154. This may also be accomplished by a finer patterning of the adhesive layer 146 such that rather than having wide adhesive free areas, only the bond pads 154 are clear of adhesive (not shown).

Figure 9:
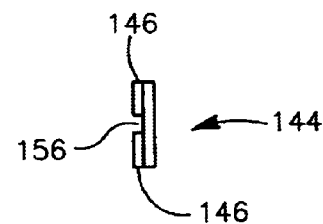
FIG. 9 is a side elevation view taken across line D—D of the die shown in FIG. 8.
Figure 10A:
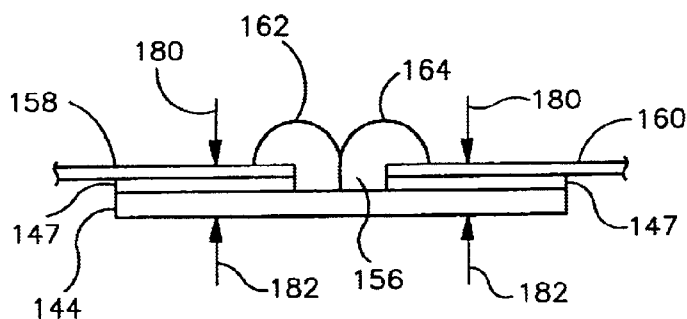
FIG. 10A is an enlarged cross sectional view showing attachment of lead fingers and bond wires to an LOC die in accordance with the present invention.

With each die 144 coated with an instant setting adhesive composition 146, as shown in Figs. 8 and 9, the lead fingers 158, 160 of a leadframe can be attached to the die 144 by the application of heat and pressure, as indicated by pressure arrow 180, 182, in Fig. 10A. Pressure may be applied by a suitable technique such as a movable arm pressing the assembly against a stationary platen. Under the effect of heat and pressure, the adhesive composition 146 is in effect sandwiched between the lead fingers 158, 160 and the die 144 to form an adhesive bond or layer therebetween. This firmly attaches the die 144 to the lead fingers 158, 160 for the subsequent encapsulation process.

Figure 10B:
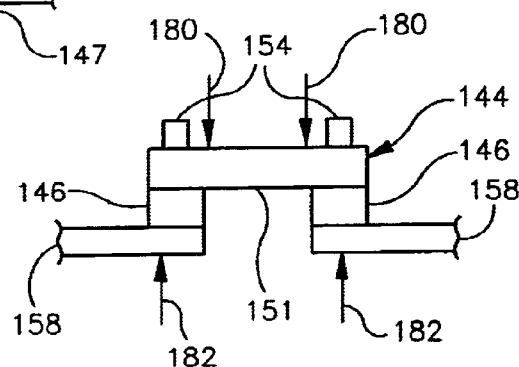
FIG. 10B is an enlarged cross sectional view showing attachment of lead fingers and bond wires to an LUC die in accordance with the present invention.
Figure 11A:
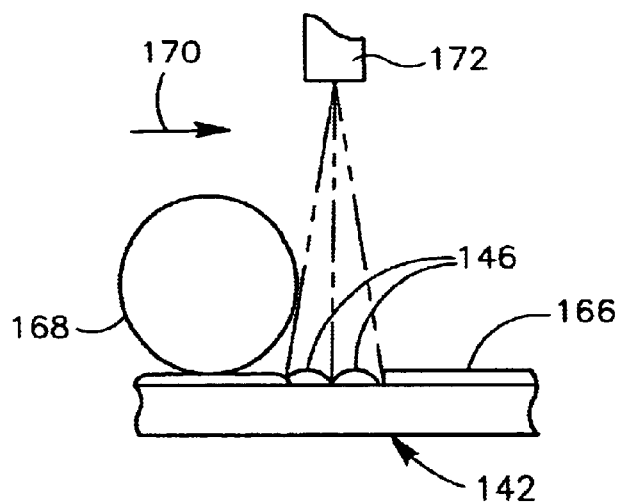
FIG. 11A is a schematic view showing one preferred method for applying an adhesive composition on a surface of a wafer or die in accordance with the present invention.
Figure 11B:
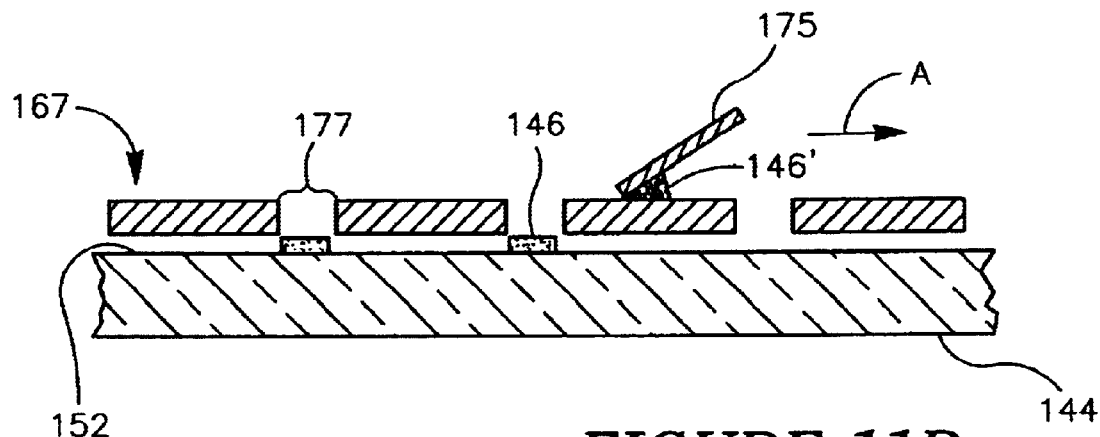
FIG. 11B is a schematic view showing one preferred method for applying an adhesive composition on a surface of a wafer or die in accordance with the present invention.
Figure 12:
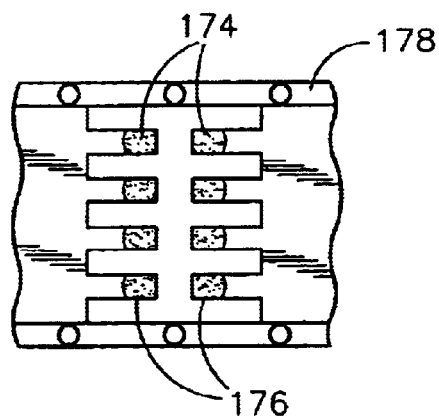
FIG. 12 is a schematic plan view showing another preferred embodiment of the placement of an adhesive composition on lead fingers of a leadframe.

As shown in Fig.10B, the die 144 includes bond pads 154 on one surface (typically the face surface). A back surface 151 is attached to lead fingers 158 with an instant setting adhesive composition 146. As described with respect to Fig. 10A, the lead fingers 158, 160 of a leadframe can be attached to the back surface 151 of the die 144 by the application of heat and pressure, as indicated by pressure arrow 180, 182. Again, under the effect of heat and pressure, the adhesive composition 146 is sandwiched between the lead fingers 158, 160 and the back surface 151 of the die 144 to form an adhesive bond or layer therebetween. This firmly attaches the die 144 to the lead fingers 158, 160 for the subsequent encapsulation process.

In forming a bond between any of the substrates described above with the instant setting adhesive composition as described herein, the pressure that is applied is typically about 5 kg of applied force. Heat is also applied at a temperature of about 200°C or less. Typically, a bond forms in about 1 second or less.--;

UNITED STATES PATENT AND TRADEMARK OFFICE
CERTIFICATE OF CORRECTION

PATENT NO.   : 6,699,928 B2
DATED        : March 2, 2004
INVENTOR(S)  : Cobbley et al.

It is certified that error appears in the above-identified patent and that said Letters Patent is hereby corrected as shown below:

Column 17,
Line 43, please delete "methalkyl" and insert -- methallyl --;
Line 67, please delete "crotyl" and insert -- cresyl --;

Column 18,
Lines 23-24, please delete "a methalkyl group, and a 2-methoxymethyl group;" and insert -- a methallyl group, a crotyl group, and a 2-methoxyethyl group; --.

Signed and Sealed this

Sixteenth Day of November, 2004

JON W. DUDAS
*Director of the United States Patent and Trademark Office*